United States Patent [19]

Carlton

[11] Patent Number: 4,580,281
[45] Date of Patent: Apr. 1, 1986

[54] SELF-ARMING, PRESCALING FREQUENCY COUNTER SYSTEM

[75] Inventor: Dale E. Carlton, Portland, Oreg.

[73] Assignee: Tektronix, Inc., Beaverton, Oreg.

[21] Appl. No.: 660,756

[22] Filed: Oct. 15, 1984

[51] Int. Cl.[4] .................. H03K 21/02; H03K 21/40
[52] U.S. Cl. ........................... 377/31; 377/55; 377/15; 377/10
[58] Field of Search ............... 377/10, 15, 30, 31, 377/111, 55; 307/200 A

[56] References Cited

U.S. PATENT DOCUMENTS

| | | | |
|---|---|---|---|
| 3,906,346 | 9/1975 | Hunter | 377/55 |
| 4,009,443 | 2/1977 | Coulter et al. | 377/30 |
| 4,110,604 | 8/1978 | Haynes et al. | 377/10 |
| 4,518,865 | 5/1985 | Iwasaki | 307/200 A |

Primary Examiner—John S. Heyman
Attorney, Agent, or Firm—John P. Dellett

[57] ABSTRACT

A self-arming, prescaling frequency counter system comprises an armable frequency counter, an envelope detector, a prescaling pulse-shaper, and a delaying means. The envelope detector detects occurrence of an oscillating signal to be frequency measured and transmits an arming signal to arm the frequency counter for the duration of the oscillating signal. The prescaling pulse-shaper is coupled to receive the oscillating signal burst and generate a pulsed test signal of frequency an integer fraction of the oscillating signal frequency. The delaying means couples the test signal to the armable frequency counter input, delaying receipt of the pulsed signal burst until after the counter is armed, and delaying termination of the pulsed signal until after counter is disarmed. To minimize the width of the smallest signal burst which can be measured, the delay time is set approximately equal to the sum of the counter arming delay time, the counter disarming delay time and one cycle period of the lowest frequency signal to be measured by the counter.

14 Claims, 2 Drawing Figures 4,580,281

SELF-ARMING, PRESCALING FREQUENCY COUNTER SYSTEM

BACKGROUND OF THE INVENTION

The present invention relates in general to armable frequency counters for measuring the frequency of an oscillating electrical signal burst and in particular to a frequency counter system which generates its own arming signal derived from the signal burst being measured.

Frequency counters typically determine the frequency of a pulsed signal in two ways. In the first method, the counter counts the number of reference clock events (which may be pulses) of known frequency that occur between successive input signal events. The signal frequency is then computed by dividing the known frequency of the reference signal by the number of counted reference events. In the second method, the counter counts input signal events occurring during a known reference period. The frequency of the input signal is then computed by dividing the number of counted input events by the known reference period. In either case the result may be used to drive a digital display, the display being updated at the end of each count cycle. In prescaled frequency counters, the signal to be measured is first applied to a frequency divider which outputs a pulse to the counter input upon receipt of every Nth signal event where N is a selected integer. Prescaling an input signal to a frequency counter permits higher frequency signal bursts to be measured by slower frequency counters.

Armable frequency counters typically begin operating only after receiving an arming signal from external circuits. As long as a counter is armed it will continue to count input or reference events, computing the signal frequency and updating the display at the end of each count cycle. After the arming signal is turned off, the counter will typically count until the next input signal event occurs and then stop counting until it is rearmed.

To minimize the length of the shortest signal burst which can be measured by an armable frequency counter, the counter should be armed before the signal burst begins. It is also important that the arming signal end before occurrence of the last input signal event. This insures the frequency computed by the counter provides a true reading and is not altered by events occurring after the end of the signal burst. In the prior art, short signal bursts were difficult to frequency measure unless a variable width pulse properly synchronized with the signal burst happened to be available for use as an arming signal. However such a useful variable width pulse was not always present. If the signal burst occurred at regular intervals and was of regular length, an arming signal of proper length and timing could sometimes be generated by adjusting a squarewave signal generator while comparing the signal burst and the arming signal on a dual trace oscilloscope. However, this method is difficult and time consuming. Finally, the method of the prior art is of no use when a frequency counter is to be armed for a single, non-reoccurring signal burst of indeterminate starting and ending time.

Therefore what is needed is a self-arming frequency counter system for measuring the frequency of a prescaled or non-prescaled signal burst wherein counter arming and disarming anticipates the beginning and end of the signal being tested.

SUMMARY OF THE INVENTION

The present invention comprises a prescaling, self-arming frequency counter including in part an armable frequency counter which may operate in either of two modes. In the first mode, the counter counts the number of reference clock events of known frequency occurring between successive input signal events, computing the signal frequency by dividing the known frequency of the reference signal by the reference event count. In the second mode, the counter counts input signal events occurring during a known reference period, computing the signal frequency by dividing the number of counted input events by the known reference period. In either case, counter operation begins on receipt of an arming signal and terminates with the first input event following termination of the arming signal.

The present invention further comprises a buffer, a prescaling pulse-shaper, an envelope detector, and a delay line. The buffer is coupled to receive an oscillating signal to be frequency measured and to generate a similar oscillating signal offset by an applied offset voltage. The offset prevents low magnitude noise on the signal input from causing a false counter reading.

The pulse-shaper converts the offset oscillating signal into a pulsed signal of the same frequency which can be measured by the armable frequency counter. Optionally, the pulse-shaper may also prescale the pulsed signal such that the frequency of the oscillating input signal is an integer multiple of the prescaled, pulsed output signal to permit measurement of higher frequency signals by a slower operating frequency counter.

The envelope detector is coupled to detect the beginning and end of the oscillating signal burst to be frequency measured and to transmit an arming signal to the armable frequency counter. Actual counter arming begins shortly after the start of the oscillating signal burst and ends shortly after the end of the signal burst. The arming and disarming delays are due to the switching times and the capacitor charging and discharging times of components in the arming circuit, and to delays inherent in the armable counter itself.

To insure that signals of the minimal burst width are frequency measured by the counter, a delay line, coupling the pulse signal output of the signal shaper to the input of the armable counter, delays the arrival of the pulsed signal to the counter until after the envelope detector has armed the counter. More specifically, the signal delay time associated with the delay line is set approximately equal to the sum of the prescaling integer divided by the frequency of the lowest frequency signal to be measured plus the counter arming on and off delay times. This signal delay time permits frequency measurement of signals of minimum burst width and prevents alteration of the frequency count by events following the measured burst.

It is therefore an object of the present invention to provide a new and improved self-arming frequency counter wherein counter arming is derived from the signal to be frequency measured.

It is another object of the present invention to provide such a new and improved self-arming frequency counter as may be adjusted to minimize the burstwidth of an input signal of a given frequency which can still be reliably measured by the frequency counter.

It is another object of the present invention to provide such a new and self-arming frequency counter as will frequency measure signal bursts of indeterminate beginning or ending time or of arbitrarily long burst width.

It is another object of the present invention to provide such a new and self-arming frequency counter wherein the signal input to the frequency counter is delayed to insure that the counter is armed prior to counter receipt of the input signal and disarmed prior to termination of the input signal.

Still further objects of the present invention are to provide such a new and self-arming frequency counter wherein the signal to be measured is buffered to avoid false measurement due to low level noise and prescaled to allow measurement of higher frequency signals by slower counting circuits.

The invention resides in the combination, construction, arrangement and disposition of the various component parts and elements incorporated in a self-arming frequency counter constructed in accordance with the principles of this invention. The present invention will be better understood and objects and important features other than those specifically enumerated above will become apparent when consideration is given to the following details and description, which when taken in conjunction with the annexed drawings describe, disclose, illustrate, and show a preferred embodiment or modification of the present invention and what is presently considered and believed to be the best mode of practicing the principles thereof.

DETAILED DESCRIPTION OF THE PREFERRED EMBODIMENT

Figure 1:
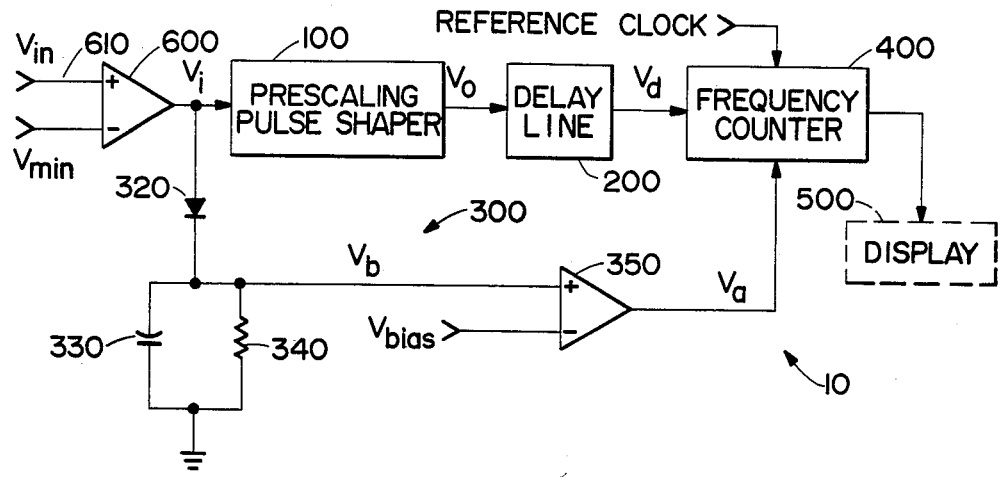
FIG. 1 is a combination block and circuit diagram of the preferred embodiment of the present invention.

FIG. 1 is a diagram of the present invention comprising a prescaling, self-arming frequency counter system generally noted by reference character 10, including prescaling pulse-shaper 100, delaying means 200, envelope detector 300, armable frequency counter 400 and input buffer 600.

Buffer 600 is a differential amplifier for generating an output signal proportional to the difference between two input signals. The oscillating signal to be frequency measured $V_{in}$ is applied to the non-inverting input of buffer 600 and a constant reference voltage $V_{min}$ is applied to the inverting input. The output of buffer 600, $V_i$, is similar to $V_{in}$ except that it has a negative offset equal to $V_{min}$ wherein $V_{min}$ is selected to insure that low amplitude noise signals on input line 610 do not cause $V_i$ to rise above zero voltage and to trigger false counter operation.

The $V_i$ signal output of buffer 600 is applied to the input of prescaling pulse-shaper 100. Prescaling pulse-shaper 100 is a "divide by N" type circuit wherein oscillating input signal $V_i$ of frequency $F_i$ results in a pulsed output signal $V_o$ of frequency $F_i/N$ where N is a selected integer. Devices suitable for use as buffer 600 and for use as prescaling pulse-shaper 100 are common in the art and readily available and therefore detailed embodiments of these devices are not discussed herein.

Pulse-shaper 100 output signal $V_o$ is applied to delaying means 200. Delaying means 200 is a circuit wherein a pulsed input signal, in this case $V_o$, results in an identical output signal, $V_d$, except that $V_d$ lags $V_o$ by a selected delay time. Delaying means 200 may comprise a network consisting of parallel capacitances and series inductors as commonly used to delay low frequency signals. For use with higher frequency signals, a length of conductor may be used as delaying means 200, the delay time being equal to the length of the line divided by the speed of propagation of a signal in the line.

The $V_i$ signal output of buffer 600 is also coupled to envelope detector 300 comprising rectifier 320, capacitor 330, resistor 340, and comparator 350. Rectifier 320 rectifies $V_i$ and applies the rectified signal, $V_b$, to the input of comparator 350 and to the grounded parallel combination of capacitor 330 and resistor 340. When $V_i$ rises above zero, $V_b$ rises above zero, charging capacitor 330. When $V_b$ rises above bias voltage $V_{bias}$ applied to the negative input of comparator 350, the comparator outputs counter arming signal $V_a$. When $V_i$ falls below the capacitor voltage, capacitor 330 discharges through resistor 340 and when the voltage on capacitor 330 falls below $V_{bias}$, comparator 350 terminates arming signal $V_a$. However, if resistor 340 is suitably large, capacitor 330 discharge time is slow. A subsequent $V_i$ pulse, occurring shortly after the first, will cause buffer 600 to recharge capacitor 330 before the capacitor voltage can fall below $V_{bias}$. Thus comparator 350 output $V_a$ will remain high during an oscillating $V_i$ signal burst as long as successive $V_i$ positive swings are of sufficient magnitude and not too infrequent.

Frequency counter 400 may determine the frequency of an input signal $V_d$ in either of two ways. In a reference count mode, the counter counts the number of reference clock events of known frequency occurring between successive $V_d$ signal pulses, computing the signal frequency by dividing the known frequency of the reference signal by the reference event count. In a signal count mode, the counter counts $V_d$ signal pulses occurring during a known reference period, computing the signal frequency by dividing the number of counted $V_d$ pulses by the known reference period. Frequency counter 400 may include provisions for displaying the computed signal frequency on digital display 500, the display being updated at the end of each measurement cycle.

Frequency counter 400 begins operating only after receiving arming signal $V_a$ and will continue to count input or reference events, computing the signal frequency and updating the display at the end of each count cycle as long as $V_a$ remains high. After arming signal $V_a$ is turned off, counter 400, in the reference count mode, will continue to count reference events until the next signal pulse is received. In the signal count mode, counter 400 counts the first signal pulse after counter disarming and then stops counting. In either case if the end of a count cycle occurs after disarming but with or before receipt of the next $V_d$ pulse, counter 400 will compute the frequency associated with the last counting period and update the display. Otherwise the display will remain fixed at the frequency computed from the last full counting cycle. Devices suitable for use as armable frequency counter 400 are known in the art and readily available and therefore a detailed embodiment of this component of the present invention is not discussed herein.

Due to the delays associated with the charging time of capacitor 330, with the switching time of comparator 350 and with such delay mechanisms as may be inherent in the counter itself, arming of counter 400 will not occur until some time after start of a $V_i$ signal burst. Likewise, after the $V_i$ signal burst ends, disarming of the counter is delayed by the capacitor 330 discharge time, by comparator 350 switching time, and by delays in counter 400 internal circuits. Thus the period during which frequency counter 400 is armed is delayed in time from the period during which the signal burst $V_i$ actually occurs. To operate in either the reference count mode or the signal count mode, counter 400 must receive at least two pulses after arming begins. In order for frequency counter 400 to operate with the shortest $V_i$ signal burst possible for a given minimum input signal frequency, $F_{im}$, the first $V_d$ pulse should not reach the counter prior to counter arming. Consequently, delay means 200 is provided and its delay time is adjusted to delay $V_d$ so that it is properly synchronized with the arming signal generated by envelope detector 300.

It is important in choosing the delay time associated with delaying means 200 that the last $V_d$ pulse is delayed until after termination of arming signal $V_a$, since the first $V_d$ pulse occurring after disarming stops counter operation in either mode. If the last $V_d$ pulse occurs before counter disarming, the counter may generate incorrect frequency counts, improperly replacing the display of the frequency of the last correctly computed $V_d$ burst count cycle. In the signal count mode, with no signal pulses occurring after counter disarming, counter 400 will incorrectly set the displayed frequency to zero. In the reference count mode, the counter will continue to count reference clock pulses until a noise pulse or a subsequent signal burst pulse occurs at the counter input and the counter would then replace the displayed frequency with some nonmeaningful value.

The most appropriate choice for the delay time associated with delaying means 200 depends on the frequency and the burst width of the signals to be measured. A longer delay time permits measurement of lower frequency signals while a shorter delay time will decrease the width of the shortest signal burst which can be measured by the counter.

Figure 2:
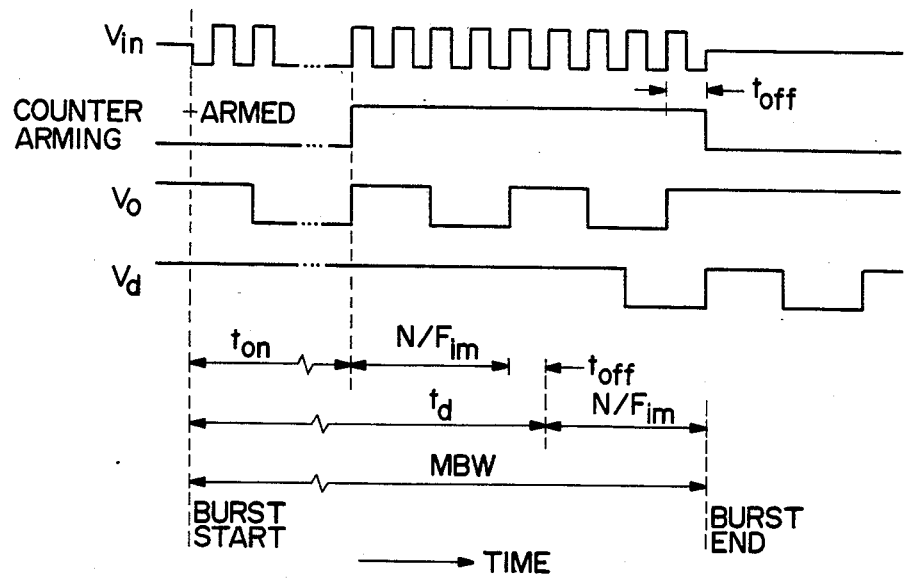
FIG. 2 is a diagram depicting timing relations between signals appearing at various points in the circuit of FIG. 1 during an input signal burst of minimum frequency and burst width.

FIG. 2 is a timing diagram showing pulse sequence relations for various signals in the circuit of FIG. 1. For simplicity, in the particular case shown, $V_{in}$ is depicted as a square-wave of frequency $F_{im}$. However, the circuit of FIG. 1 will operate with other forms of oscillating input signal. Assuming prescaling pulse-shaper 100 divides $V_{in}$ input pulses by a factor of four (N=4), a $V_o$ pulse will begin on every second $V_{in}$ pulse and will end on every fourth $V_{in}$ pulse.

Counter 400 arming is delayed after the start of the $V_{in}$ signal burst by $t_{on}$, the sum of the delays in envelope detector 300 and the arming delays internal to counter 400. Counter disarming is delayed by $t_{off}$, the sum of the turn off delays in detector 300 and counter 400. In order for counter 400 to operate properly it must receive at least one $V_d$ pulse leading edge (positive going) before disarming and one $V_d$ pulse leading edge after disarming. Thus the $V_{in}$ signal burst must be long enough to generate at least two $V_d$ pulses with the last $V_d$ pulse beginning after counter arming ends.

$V_d$ signal pulses are delayed from $V_o$ signal pulses by $t_d$, the delay time associated with delay line 200. Delay time $t_d$ is selected as follows:

$$t_d = t_{on} + N/F_{im} + t_{off} \quad (1)$$

With this selected delay time, as shown in FIG. 2, the first leading edge of $V_d$ can occur no later than the moment of counter disarming. In this "worst case" situation, prescaling pulse-shaper 100 is initially in the state wherein $V_o$ is high and two $V_{in}$ pulses are required to drive $V_o$ low. Also, in the particular case shown, $V_{in}$ begins on a negative rather than a positive swing. If pulse shaper 100 had been in any other state when it received the first $V_i$ pulse, the first $V_d$ pulse would have occurred earlier, before counter disarming. If delay line 200 delay time $t_d$ were longer than as shown, then it is possible that the first $V_d$ leading edge could occur after counter disarming. Also, if another $V_i$ signal burst of a lower frequency than $F_{im}$ as shown were to be measured, it is possible that the first $V_d$ leading edge would occur after counter disarming. However, the first leading edge of a $V_{in}$ signal burst of frequency higher than $F_{im}$ would always occur before counter disarming.

Also, with the delay time $t_d$ adjusted as in equation (1) above, the last leading edge in the $V_d$ signal must always occur after counter disarming. The first $V_d$ leading edge could occur as much as one $V_d$ cycle earlier than depicted in FIG. 2 if $V_{in}$ initially includes a positive swing and if the first $V_{in}$ leading edge forces prescaling pulse-shaper 100 to generate a $V_o$ positive edge. In this situation, the second leading edge of $V_d$ would occur just as the counter disarms. If $t_{on}$ is very small compared to the period of $V_o$, then the second leading edge of $V_d$ would be the last. Thus if $t_d$ were chosen smaller than as indicated in equation (1), the last $V_d$ leading edge associated with a short signal burst could occur before counter disarming. Therefore, optimal measurement reliability for input signals of frequency $F_{im}$ or greater is obtained when the delay time of delay line 200 is adjusted approximately as indicated in equation (1).

In addition to the minimum frequency constraint on an input signal, to insure that counter disarming does not occur before the leading edge of the $V_d$ signal, an input signal of any frequency must have a minimum burst width (MBW) as follows:

$$MBW = t_d + N/F_{im} = t_{on} + 2N/F_{im} + t_{off} \quad (2)$$

In the design of self-arming counter system 10 of the present invention, where it is desirable to measure signals of low frequency ($F_{im}$ small), delay line 200 may be made very long so that delay time $t_d$ is large, satisfying equation (1). However, in doing so, the minimum burst width for all input signals to be measured must be large, according to equation (2). Conversely where it is desirable to frequency measure very short signal bursts, a short delay line may be used to obtain a small delay $t_d$ and therefore a small MBW according to equation (2). However, according to equation (1), with such a small delay, only high frequency signals ($F_{im}$ large) can be reliably frequency measured. The delay time chosen therefore represents a tradeoff between minimum frequency and minimum bandwidth constraints on the signal to be measured.

The self-arming frequency counter system of the present invention thus anticipates the beginning and end of the signal to be measured to allow reliable measurement of signal bursts of minimal burstwidth and frequency, and of indeterminate beginning or ending times. The present invention also operates with a prescaling pulse-shaper permitting measurement of high frequency signals with lower speed counters and incorporates a buffer to prevent low magnitude input noise from causing false counter operation.

While a preferred embodiment of the present invention has been described, it will be apparent to those skilled in the art that many changes and modifications may be made without departing from the invention in its broader aspects. The appended claims are therefore intended to cover all such changes and modifications as fall within the true spirit and scope of the present invention.

I claim:

1. A self-arming frequency counter system for measuring the frequency of an applied test signal comprising:
   means for measuring the frequency of the test signal when armed by an applied arming signal,
   means for applying the arming signal to the measuring means on detection of the test signal commencing following initiation of the test signal and ending following termination of the test signal, and
   means for delaying application of the test signal to the measuring means until the arming signal begins.

2. A self-arming frequency counter system as in claim 1 wherein, for a selected minimum test signal frequency, the delaying means also delays termination of the test signal at the measuring means until after termination of measuring means arming.

3. A self-arming frequency counter system as in claim 2 wherein the delaying means delays application of the test signal to the measuring means by a delay time approximately equal to the sum of the following:
   a. the time difference between initiation of the test signal and measuring means arming,
   b. the time delay between termination of the test signal and termination of measuring means arming, and
   c. the period of one cycle of the lowest frequency test signal to be measured.

4. A self-arming frequency counter system for measuring the frequency of an oscillating signal comprising:
   a pulse-shaper coupled to receive the oscillating signal and to generate a pulsed test signal output of the same frequency as the oscillating signal,
   means for measuring the frequency of the pulsed test signal when enabled by an applied arming signal,
   means for applying the arming signal to the measuring means on detection of the oscillating signal commencing following initiation of the oscillating signal and ending following termination of the oscillating signal, and
   means for delaying application of the test signal to the measuring means until the arming signal begins.

5. A self-arming frequency counter system as in claim 4 wherein the arming means comprises:
   means for rectifying the oscillating signal,
   a capacitor coupled for charging by the rectified oscillating signal to a voltage in excess of a selected reference voltage,
   means coupled to generate the arming signal whenever the capacitor voltage exceeds the reference voltage, and
   a resistor coupled and sized to discharge the capacitor below the reference voltage only after termination of the rectified oscillating signal, thereby terminating the arming signal.

6. A self-arming frequency counter system as in claim 4 wherein the delaying means comprises a conductor of length equal to the speed of propagation of the pulsed test signal in the conductor divided by the delay time.

7. A self-arming frequency counter system as in claim 4 wherein, for a selected minimum pulsed test signal frequency, the delaying means also delays termination of the pulsed test signal at the measuring means until after termination of measuring means arming.

8. A self-arming frequency counter system as in claim 7 wherein the delaying means delays application of the pulsed test to the measuring means by a delay time approximately equal to the sum of the following:
   a. the time difference between initiation of the pulsed test and measuring means arming,
   b. the time delay between termination of the pulsed test and termination of measuring means arming, and
   c. the period of one cycle of the lowest frequency pulsed test to be measured.

9. A self-arming frequency counter system for measuring the frequency of an oscillating signal comprising:
   a prescaling pulse-shaper coupled to receive the oscillating signal and to generate a pulsed test output, the frequency of the oscillating signal being an integer multiple of the frequency of the pulsed test signal,
   means for measuring the frequency of the pulsed test signal when armed by an applied arming signal,
   means for applying the arming signal to the measuring means on detection of the oscillating signal commencing following initiation of the oscillating signal and ending following termination of the oscillating signal, and
   means for delaying application of the pulsed test signal to the measuring means until the arming signal begins.

10. A self-arming frequency counter system as in claim 9 wherein, for a selected minimum pulsed test signal frequency, the delaying means also delays termination of the pulsed test signal at the measuring means until after termination of measuring means arming.

11. A self-arming frequency counter system as in claim 10 wherein the delaying means delays application of the pulsed test signal to the measuring means by a delay time approximately equal to the sum of the following:
    a. the time difference between initiation of the pulsed test signal and measuring means arming,
    b. the time delay between termination of the pulsed test signal and termination of measuring means arming, and
    c. the period of one cycle of the lowest frequency pulsed test signal to be measured.

12. A self-arming frequency counter system for measuring the frequency of an oscillating signal comprising:
    a buffer coupled to negatively offset the oscillating signal by an amount equal to an applied offset voltage,
    a prescaling pulse-shaper coupled to receive the offset oscillating signal and to generate a pulsed test signal output, the frequency of the offset oscillating signal being an integer multiple of the frequency of the pulsed test signal,
    means for measuring the frequency of the pulsed test signal when armed by an applied arming signal,
    means for applying the arming signal to the measuring means on detection of the offset oscillating signal commencing following initiation of the offset oscillating signal and ending following termination of the offset oscillating signal, and
    means for delaying application of the pulsed test signal to the measuring means until the arming signal begins.

13. A self-arming frequency counter system as in claim 12 wherein, for a selected minimum pulsed test signal frequency, the delaying means also delays termination of the pulsed test signal at the measuring means until after termination of measuring means arming.

14. A self-arming frequency counter system as in claim 12 wherein the delaying means delays application of the pulsed test signal to the measuring means by a delay time approximately equal to the sum of the following:
  a. The time difference between initiation of the pulsed test signal and measuring means arming,
  b. the time delay between termination of the pulsed test signal and termination of measuring means arming, and
  c. the period of one cycle of the lowest frequency pulsed test signal to be measured.

* * * * *